(12) United States Patent
Nakahara

(10) Patent No.: US 9,156,307 B2
(45) Date of Patent: Oct. 13, 2015

(54) PLASMA ETCHING METHOD AND PLASMA ETCHING APPARATUS

(71) Applicant: TOKYO ELECTRON LIMITED, Tokyo (JP)

(72) Inventor: Yoichi Nakahara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/085,337

(22) Filed: Nov. 20, 2013

(65) Prior Publication Data

US 2014/0076848 A1      Mar. 20, 2014

Related U.S. Application Data

(63) Continuation-in-part of application No. 13/973,585, filed on Aug. 22, 2013, now abandoned.

(60) Provisional application No. 61/696,878, filed on Sep. 5, 2012.

(30) Foreign Application Priority Data

Aug. 27, 2012   (JP) .................................. 2012-186614

(51) Int. Cl.
 *H01L 21/302*   (2006.01)
 *B44C 1/22*   (2006.01)
 (Continued)

(52) U.S. Cl.
 CPC .............. *B44C 1/227* (2013.01); *H01J 37/321* (2013.01); *H01J 37/3266* (2013.01); *H01J 37/32091* (2013.01); *H01L 21/02164* (2013.01); *H01L 21/02274* (2013.01); *H01L 21/0337* (2013.01); *H01L 21/3105* (2013.01); *H01L 21/31116* (2013.01); *H01L 21/31138* (2013.01); *H01L 21/32137* (2013.01); *H01L 21/32139* (2013.01); *H01L 21/68792* (2013.01)

(58) Field of Classification Search
 CPC .............. H01L 21/3065; H01L 21/308; H01L 21/31058; H01L 21/31116; H01L 21/31127; H01L 21/03
 USPC ......... 438/706, 710, 712, 714, 717, 719, 723, 438/725, 762, 763; 216/41, 47, 67, 80
 See application file for complete search history.

(56) References Cited

U.S. PATENT DOCUMENTS 8,148,269 B2 * 4/2012 Balseanu et al. .............. 438/706
2005/0159008 A1 * 7/2005 Chang et al. .................. 438/703
(Continued)

FOREIGN PATENT DOCUMENTS

JP   2010-212415 A   9/2010

*Primary Examiner* — Lan Vinh
(74) *Attorney, Agent, or Firm* — Rothwell, Figg, Ernst & Manbeck, P.C.

(57) ABSTRACT

A plasma etching method deposits a silicon-containing deposit by a plasma processing using a Si-containing gas on an object to be processed that includes a film to be processed, an organic film formed in a plurality of narrow linear portions on the film to be processed, and a rigid film that covers both the film to be processed which is exposed between the linear portions and the linear portions. In the plasma etching method, each of the plurality of narrow linear portions of the organic film and the film to be processed between the linear portions are exposed by etching the silicon-containing deposit by plasma of CF-based gas and CHF-based gas after the silicon-containing deposit is deposited.

9 Claims, 10 Drawing Sheets

(51) Int. Cl.
*H01L 21/02* (2006.01)
*H01J 37/32* (2006.01)
*H01L 21/687* (2006.01)
*H01L 21/033* (2006.01)
*H01L 21/3105* (2006.01)
*H01L 21/311* (2006.01)
*H01L 21/3213* (2006.01)

(56) References Cited

U.S. PATENT DOCUMENTS

2012/0064463 A1* 3/2012 Park et al. .................. 430/326
2012/0077344 A1* 3/2012 Zhou et al. .................. 438/702

* cited by examiner

PLASMA ETCHING METHOD AND PLASMA ETCHING APPARATUS

CROSS-REFERENCE TO RELATED APPLICATIONS

This application is a continuation in part of U.S. patent application Ser. No. 13/973,585, filed on Aug. 22, 2013, which claims priority from Japanese Patent Application No. 2012-186614, filed on Aug. 27, 2012 with the Japan Patent Office, and U.S. Provisional Patent Application No. 61/696,878 filed on Sep. 5, 2012 with the USPTO, the disclosures of which are incorporated herein in their entireties by reference.

TECHNICAL FIELD

The present disclosure relates to various aspects and exemplary embodiments of a plasma etching method and a plasma etching apparatus.

BACKGROUND

A double patterning technology performed by plasma etching of $CF_4$ gas has been known. The double patterning technology uses a wafer which includes a film to be processed, an organic film formed in a plurality of narrow lines on the film to be processed, and a Si oxide film that covers both the respective lines and the film to be processed which is exposed between the lines. In the double patterning technology, the Si oxide film is etched first to expose the respective lines of the organic film and the film to be processed. Then, the exposed organic film is selectively removed. Thereafter, the film to be processed is etched using the remaining Si oxide film as a mask. See, for example, Japanese Patent Application Laid-Open No. 2010-212415.

SUMMARY

A plasma etching method according to an aspect of the present disclosure includes: depositing a silicon-containing deposit by a plasma processing using a Si-containing gas on an object to be processed that includes a film to be processed, an organic film formed in a plurality of narrow linear portions on the film to be processed, and a rigid film that covers both the film to be processed which is exposed between the respective linear portions and the linear portions, and, after depositing the silicon-containing deposit, a first etching of etching the deposit by plasma of a CF-based gas and a CHF-based gas, thereby exposing each of the plurality of narrow linear portions of the organic film and the film to be processed between each of the plurality of narrow linear portions.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
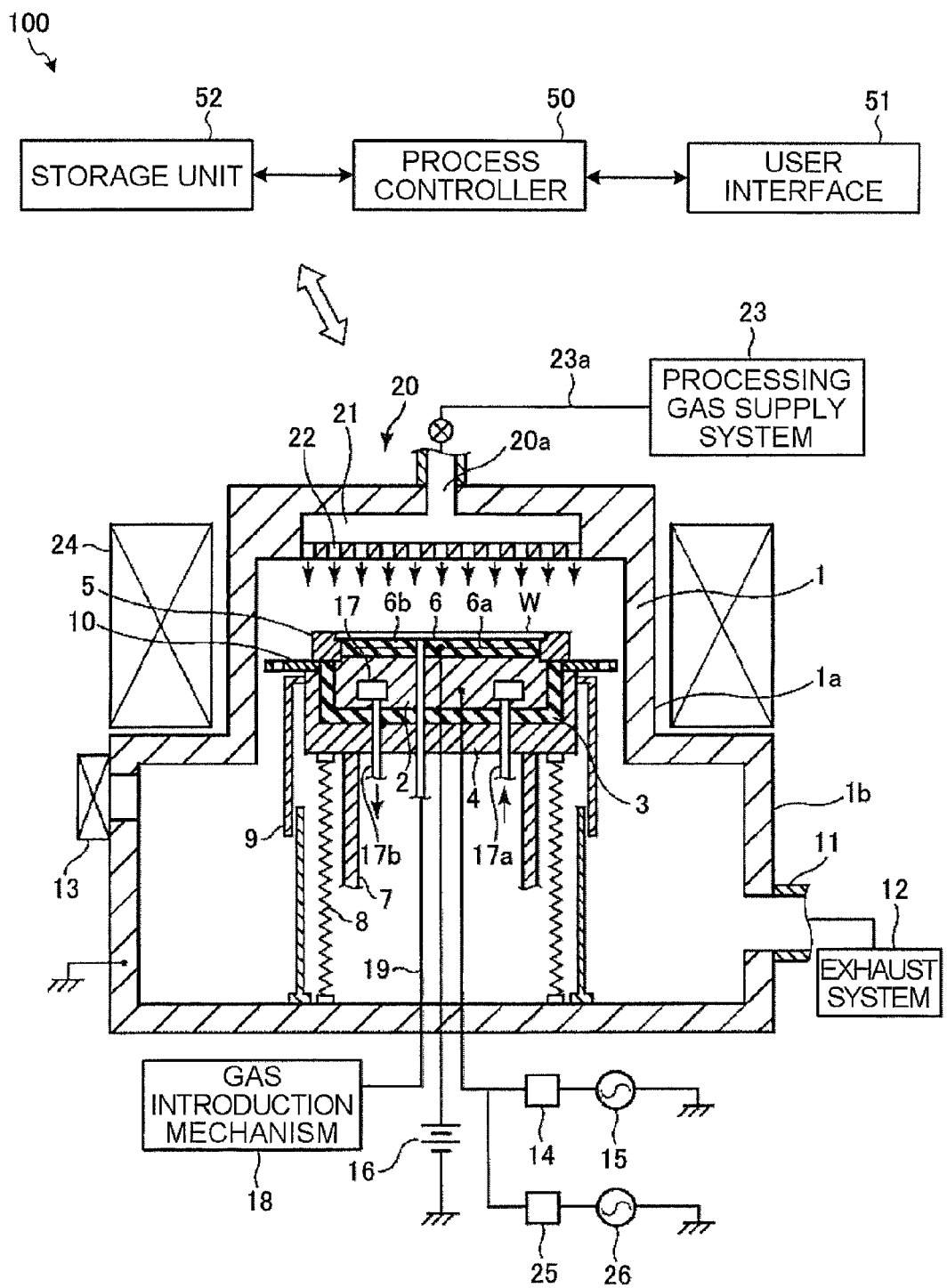
FIG. 1 is a cross-sectional view illustrating a plasma etching apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The above-described technology has a problem in that, when the Si oxide film is etched to form a space for exposing each of the plurality of lines of the organic film and the film to be processed, remaining shoulder portions of the Si oxide film are plasma-etched to be rounded. As a result, when the film to be processed is being etched, a line width may not be formed accurately and further, the pattern may not be sustained and thus, the film to be processed may not be etched.

That is, in the step of performing etching on the Si oxide film and forming a space for exposing each of the plurality of lines of the organic film and the film to be processed by the plasma etching, the organic film in which the top of the line is exposed remains on the film to be processed and the Si oxide film remains on both sides of the organic film in the space. Here, the shapes of the shoulder portions of both sides where the organic film is interposed there between may be rounded on the top of the Si oxide film. As a result, for example, the thickness of the mask at the rounded portions decreases and the function as a mask deteriorates in a subsequent etching process.

A plasma etching method according to an exemplary embodiment of the present disclosure includes: depositing a silicon-containing deposit by plasma processing using a Si-containing gas on an object to be processed that includes a film to be processed, an organic film formed as a plurality of narrow linear portions on the film to be processed, and a rigid film that covers both the linear portions and the film to be processed which is exposed between each of the plurality of narrow linear portions, and, after depositing the silicon-containing deposit, a first etching of etching the deposit by plasma of a CF-based gas and a CHF-based gas, thereby exposing each of the plurality of narrow linear portions of the organic film and the film to be processed between the plurality of linear portions.

The above-described plasma etching method further includes: an ashing process of selectively removing the exposed organic film; a second etching of etching the remaining rigid film; and a third etching of etching the film to be processed using the remaining rigid film as a mask.

In the above-described plasma etching method, a bias voltage is applied in the deposition process.

The above-described plasma etching method further includes performing a surface modifying processing of the silicon-containing deposit by plasma using hydrogen gas after the silicon-containing deposit is deposited. The first etching process is performed after the surface modifying processing.

In the above-described plasma etching method, the Si-containing gas contains $SiCl_4$ or $SiF_4$.

In the above-described plasma etching method, the Si-containing gas further contains $O_2$ gas.

In the above-described plasma etching method, the CF-based gas contains $CF_4$ or $C_4F_8$ and the CHF-based gas contains any one of $CHF_3$, $CH_2F_2$, and $CH_3F$.

A plasma etching apparatus according to another exemplary embodiment of the present disclosure includes: a chamber configured to perform a plasma etching processing on an object to be processed including a film to be processed, an organic film formed in a plurality of narrow linear portions on the film to be processed, and a rigid film that covers both the film to be processed which is exposed between the linear portions and the linear portions; an exhaust unit configured to depressurize the chamber; a gas supply unit configured to supply a processing gas into the chamber; and a control unit configured to deposit a silicon-containing deposit material using a Si-containing gas on the object to be processed by a plasma processing and to perform a first etching of etching the silicon-containing deposit by a plasma of CF-based gas and a CHF-based gas after the silicon-containing deposit is deposited, thereby exposing each of the plurality of narrow linear portions of the organic film and the film to be processed between the plurality of linear portions.

In the above-described plasma etching apparatus, the control unit performs an ashing processing of selectively removing the exposed organic film, a second etching of etching the remaining rigid film, and a third etching of etching the film to be processed using the remaining rigid film as a mask.

In the above-described plasma etching apparatus, the control unit applies bias voltage when the silicon-containing deposit is deposited by the plasma processing using the Si-containing gas.

In the above-described plasma etching apparatus, the control unit performs a surface modifying processing of the silicon-containing deposit by plasma using hydrogen gas after the silicon-containing deposit is deposited and then performs the first etching after the surface modifying processing.

In the above-described plasma etching apparatus, the Si-containing gas contains $SiCl_4$ or $SiF_4$.

In the above-described plasma etching apparatus, the Si-containing gas further contains $O_2$ gas.

In the above-described plasma etching apparatus, the CF-based gas contains $CF_4$ or $C_4F_8$ and the CHF-based gas contains any one of $CHF_3$, $CH_2F_2$, and $CH_3F$.

According to the etching apparatus as described above, the shapes of the shoulder portions may be improved.

Hereinafter, exemplary embodiments of a plasma etching apparatus and a plasma etching method which are disclosed will be described in detail with reference to the accompanying drawings. Further, the present disclosure disclosed is not limited by the exemplary embodiments to be described below. Respective exemplary embodiments may be appropriately combined within the scope in which a processing content is not contradicted.

Exemplary Embodiments

A plasma etching method according to an exemplary embodiment includes a deposition process of depositing to cover a silicon-containing deposit with a rigid film by plasma processing using Si-containing gas on an object to be processed including a film to be processed, an organic film having a plurality of narrow linear (line) portions formed on the film to be processed, and a rigid film formed to cover each of the linear (line) portions and the film to be processed which is exposed in a space between the plurality of linear portions. Also, the plasma etching method according to the embodiment includes a first etching of etching the deposit by plasma using CF-based gas and CHF-based gas after depositing the silicon-containing deposit, thereby exposing respective linear (line) portions of the organic film and the film to be processed (in a space) between the linear portions.

The plasma etching method of the exemplary embodiment further includes: an ashing process of selectively removing the exposed organic film; a second etching process of etching the remaining rigid film; and a third etching process of etching the film to be processed using the remaining rigid film as a mask.

In the plasma etching method of the exemplary embodiment, bias voltage is applied in the deposition process.

The plasma etching method of the exemplary embodiment further includes a surface modifying process of performing a surface modifying processing of the silicon-containing deposit by plasma using hydrogen gas after the silicon-containing deposit is deposited. Further, in the first etching process of the plasma etching method of the exemplary embodiment in the first etching process, etching is performed after the surface modifying processing.

In the plasma etching method of the exemplary embodiment, the Si-containing gas contains $SiCl_4$ or $SiF_4$. In the plasma etching method of the exemplary embodiment, the Si-containing gas further contains $O_2$ gas.

In the plasma etching method of the exemplary embodiment, the CF-based gas contains $CF_4$ or $C_4F_8$ and the CHF-based gas contains any one of $CHF_3$, $CH_2F_2$, and $CH_3F$.

A plasma etching apparatus according to another exemplary embodiment includes a chamber configured to perform a plasma etching processing on an object to be processed that includes a film to be processed, an organic film formed in a plurality of narrow linear (line) portions on the film to be processed, and a rigid film that covers both the linear (line) portions and the film to be processed which is exposed (in a space) between the linear (line) portions. Further, the plasma etching apparatus of the exemplary embodiment includes an exhaust unit configured to depressurize the chamber and a gas supply unit configured to supply processing gas into the chamber. In addition, the plasma etching apparatus of the exemplary embodiment includes a control unit configured to perform deposition of a silicon-containing deposit on the object to be processed by a plasma processing using Si-containing gas and to perform a first etching on the silicon-containing deposit by plasma of CF-based gas and CHF-based gas after depositing the silicon-containing deposit, so as to expose the plurality of linear (line) portions of the organic film and the film to be processed between the narrow linear (line) portions.

Etching Apparatus According to Exemplary Embodiment

FIG. 1 is a cross-sectional view illustrating a plasma etching apparatus according to an exemplary embodiment. In the exemplary embodiment illustrated in FIG. 1, a parallel flat plasma etching apparatus is illustrated as a plasma etching apparatus 100. As illustrated in FIG. 1, the plasma etching apparatus 100 includes a chamber (processing container) 1. The chamber (processing container) 1 is hermetically configured and formed in a cylindrical shape including a step having an upper small-diameter portion 1a and a lower large-diameter portion 1b. Further, the chamber (processing container) 1 includes a wall portion made of aluminum.

A support table 2 configured to horizontally support a wafer W which will be an object to be processed is provided in the chamber 1. The support table 2 is made of, for example, aluminum and supported by a conductive supporter 4 through an insulating plate 3. Further, a focus ring 5 made of, for example, Si, is provided on the upper outer periphery of the support table 2. The support table 2 and the supporter 4 may be moved up and down by a ball screw mechanism including a ball screw 7 and a lower driving unit of the supporter 4 is covered with a bellows 8 made of a stainless steel (SUS). A bellows cover 9 is provided outside the bellows 8. Further, a baffle plate 10 is installed on the exterior of the focus ring 5 and the focus ring 5 is electrically connected with the chamber 1 through the baffle plate 10, the supporter 4, and the bellows 8. The chamber 1 is grounded.

An exhaust port 11 is formed on a side wall of a lower portion 1b of the chamber 1 and an exhaust system 12 is connected to the exhaust port 11. When a vacuum pump of the exhaust system 12 is activated, the inside of the chamber 1 may be depressurized to a predetermined vacuum degree. Meanwhile, a gate valve 13 configured to open/close a wafer W carrying-in/out port is provided at the upper portion of the side wall of the lower portion 1b of the chamber 1. The exhaust system 12 is also referred to as a "depressurization unit".

A first high-frequency power supply 15 for forming plasma is connected to the support table 2 through a matching unit 14 and high-frequency power having a predetermined frequency is supplied to the support table 2 from the first high-frequency power supply 15. A shower head 20 to be described below is installed above the support table 2 parallel to the support table 2 to be opposite to the support table 2. The shower head 20 is grounded. The support table 2 and the shower head 20 function as a pair of electrodes.

A second high-frequency power supply 26 is connected to a feeder of the first high-frequency power supply 15 through a matching unit 25. The second high-frequency power supply 26 supplies high-frequency power lower than the frequency of the first high-frequency power supply 15 and overlaps the high-frequency power for forming plasma.

An electrostatic chuck 6 configured to electrostatically adsorb and hold the wafer W is installed on the surface of the support table 2. In the electrostatic chuck 6, an electrode 6a is interposed between insulators 6b and a DC power supply 16 is connected to the electrode 6a. In addition, voltage is applied to the electrode 6a from the DC power supply 16 and, as a result, the wafer W is adsorbed by electrostatic force, for example, Coulomb's force.

A refrigerant chamber 17 is provided in the inside of the support table 2 and, in the refrigerant chamber 17, refrigerant is introduced through a refrigerant introduction pipe 17a, discharged through a refrigerant discharge pipe 17b, and circulated. The cool heat is transferred to the wafer W through the support table 2 and, as a result, the processed surface of the wafer W is controlled to a desired temperature.

Even if the chamber 1 is exhausted by the exhaust system 12 to be kept in a vacuum state, cooling gas is introduced between the surface of the electrostatic chuck 6 and the rear surface of the wafer W through a gas supply line 19 by a gas introduction mechanism 18 such that the wafer W is effectively cooled by the refrigerant circulated to the refrigerant chamber 17. When the cooling gas is introduced in this manner, the cool heat of the refrigerant is effectively transferred to the wafer W, thereby increasing the cooling efficiency of the wafer W. As for the cooling gas, for example, He may be used.

The shower head 20 is installed at a ceiling portion of the chamber 1 to face the support table 2. A plurality of gas discharge holes 22 are provided on the bottom surface of the shower head 20 and a gas introduction unit 20a is provided at an upper portion of the shower head 20. Further, a space 21 is formed in the inside of the shower head 20. A gas supply pipe 23a is connected to the gas introduction unit 20a and a processing gas supply system 23 configured to supply a processing gas composed of an etching gas and a diluted gas is connected to the other end of the gas supply pipe 23a. The processing gas supply system 23 is also referred to as a "gas supply unit". The processing gas reaches the space 21 of the shower head 20 from the processing gas supply system 23 through the gas supply pipe 23a and the gas introduction unit 20a and is discharged through the gas discharge holes 22.

Multi-pole magnets 24 are concentrically placed around the upper portion 1a of the chamber 1 and a magnetic field is formed around the processing space between the support table 2 and the shower head 20. The multi-pole magnets 24 are rotatable by a rotation mechanism (not illustrated).

Figure 2:
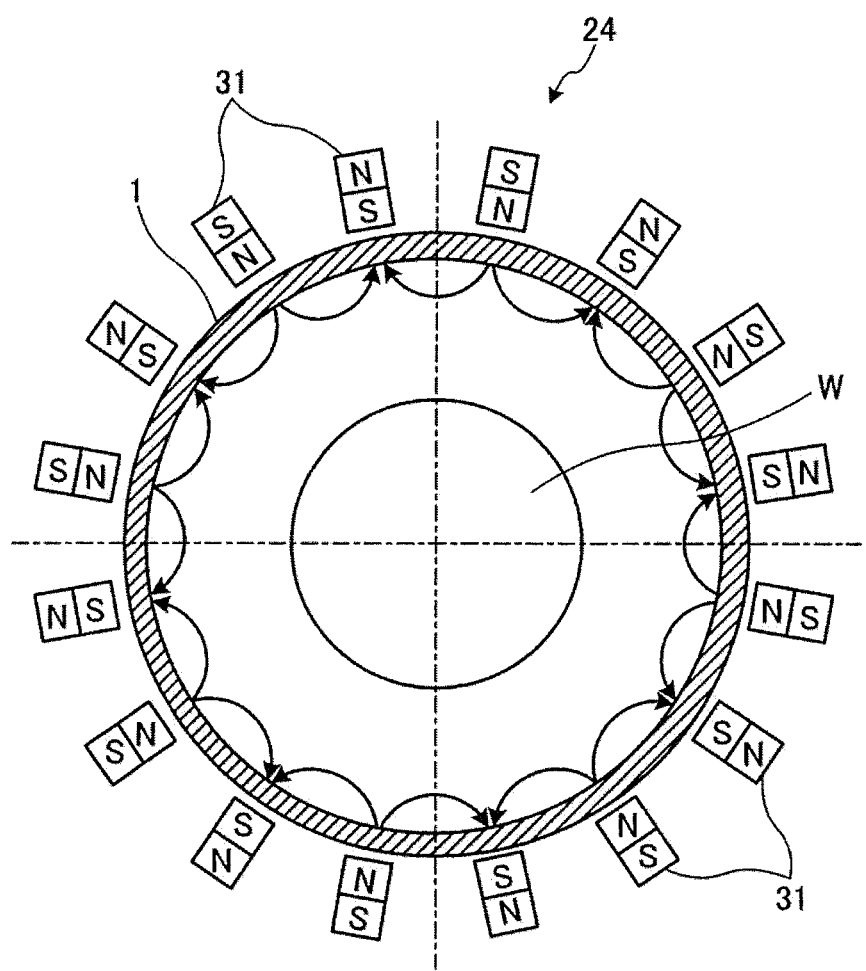
FIG. 2 is a horizontal cross-sectional view schematically illustrating multi-pole magnets placed around a chamber of the plasma etching apparatus according to the exemplary embodiment.

FIG. 2 is a horizontal cross-sectional view schematically illustrating the multi-pole magnets placed around the chamber of the plasma etching apparatus according to the exemplary embodiment. The multi-pole magnets 24 are configured such that a plurality of segment magnets 31 configured by permanent magnets are arranged in a ring shape while being supported by a support member (not illustrated) as illustrated in the horizontal cross-sectional view of FIG. 2. In the exemplary embodiment illustrated in FIG. 2, sixteen segment magnets 31 are placed in a multi-pole state in the ring shape (concentric circle shape). That is, the multi-pole magnets 24 are arranged such that magnetic pole directions of the plurality of adjacent segment magnets 31 are opposite to one another and, as a result, magnetic force lines are formed between the adjacent segment magnets 31 as illustrated in the figure. For example, a magnetic field of 0.02 T to 0.2 T (200 to 2000 Gauss), preferably, 0.03 T to 0.045 T (300 to 450 Gauss) is formed only at the periphery of the processing space. Therefore, the wafer placement portion is in a substantially non-magnetic field state. The magnetic field intensity is defined as described above since the magnetic field leaks when the magnetic field is excessively strong and a plasma confining effect may not be obtained when the magnetic field is excessively weak. However, since the appropriate magnetic field intensity depends on, for example, an apparatus structure, a range of the magnetic field intensity varies depending on the apparatus. Further, the substantially non-magnetic field state of the wafer placement portion also includes a case in which a magnetic field that influences an etching processing is not formed in the wafer placement portion and a magnetic field that does not substantially influence the wafer exists as well as a case in which no magnetic field exists. The substantially non-magnetic field state is applied to inductive coupled plasma (ICP) as a plasma source that forms no magnetic field.

In the state illustrated in FIG. 2, a magnetic field having, for example, a magnetic flux density of 420 μT (4.2 Gauss) or less is applied to the periphery of the wafer and, as a result, a plasma confining function is presented.

Figure 3A:
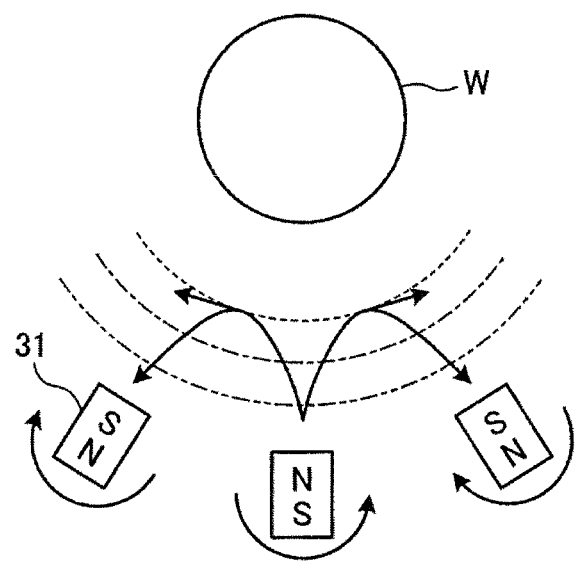
FIGS. 3A to 3C are diagrams for describing a rotating operation of a segment magnet of the plasma etching apparatus according to the exemplary embodiment and a change in magnetic field in that case.
Figure 3B:
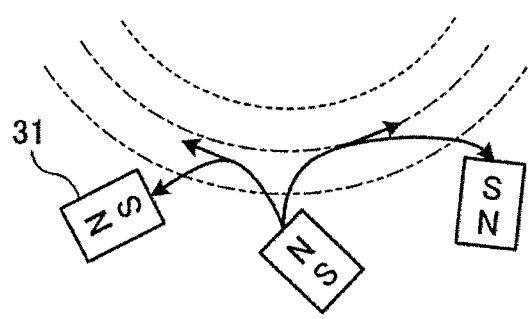
Figure 3C:
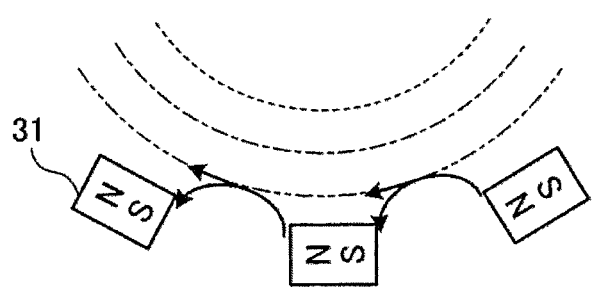

FIG. 3 is a view for describing a rotating operation of a segment magnet of the plasma etching apparatus according to the exemplary embodiment and a change in magnetic field at the time of the rotation operation. Each of the segment magnets 31 is configured to be rotatable around a vertical shaft by a segment magnet rotating mechanism (not illustrated). As illustrated in FIGS. 2 and 3A, while a magnetic pole of each segment magnet 31 is directed towards the chamber 1, for example, segment magnets 31 are rotated in synchronization in the opposite directions as illustrated in FIGS. 3B and 3C. Therefore, segment magnets 31 which are spaced apart from each other at an interval of one segment magnet rotate in the same direction. FIG. 3B illustrates a state in which the segment magnets 31 are rotated by 45 degrees and FIG. 3C illustrates a state in which the segment magnets 31 are rotated by 90 degrees. When the segment magnets 31 are rotated in this manner, a state in which the multi-pole magnetic field is substantially formed and a state in which the multi-pole magnetic field is not formed may be switched to each other. Since a case in which the multi-pole magnetic field may effectively act or the multi-pole magnetic field may not act depending on a type of a film to be etched, an appropriate etching condition may be selected depending on the film when the state in which the multi-pole magnetic field is formed and the state in which the multi-pole magnetic field is not formed may be switched to each other.

Each component of the plasma etching apparatus 100 is configured to be connected to and controlled by a process controller 50 having a CPU. A user interface 51 constituted by a keyboard with which a process manager performs an input operation of a command for managing the plasma etching apparatus 100 and a display that visualizes and displays an operating status of the plasma etching apparatus 100 is connected to the process controller 50.

A storage unit 52 that stores a control program for implementing various processes executed by the plasma etching apparatus 100 through a control by the process controller 50 or a recipe having processing condition data recorded therein is connected to the process controller 50.

An arbitrary recipe is called from the storage unit 52 by, for example, an instruction from the user interface 51 and executed by the process controller 50 and desired processing may be performed in the plasma etching apparatus 100 under the control by the process controller 50. As for the recipe, for example, a recipe stored in a computer readable storage media such as, for example, a CD-ROM, a hard disk, a flexible disk, a flash memory may be used or a recipe frequently transmitted from other apparatuses through, for example, a dedicated line may be used. The process controller 50 is also called a "control unit".

For example, the process controller 50 controls each component of the plasma etching apparatus 100 in order to perform a plasma etching method to be described below. More specifically, the process controller 50 supplies Si-containing gas into the chamber 1 from the processing gas supply system 23 and deposits a silicon-containing deposit by plasma processing using the Si-containing gas. In addition, the process controller 50 performs etching by plasma of CF-based gas and CHF-based gas after the silicon-containing deposit is deposited to expose a film to be processed (in a space) between the organic film and each linear portion. The processes controlled by the process controller 50 will be described below in detail.

Figure 4A:
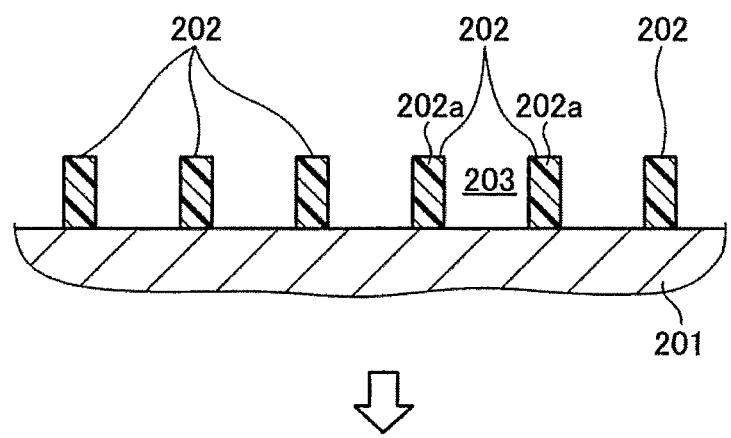
FIGS. 4A and 4B are cross-sectional views schematically illustrating a structure of an object to be processed according to an exemplary embodiment.
Figure 4B:
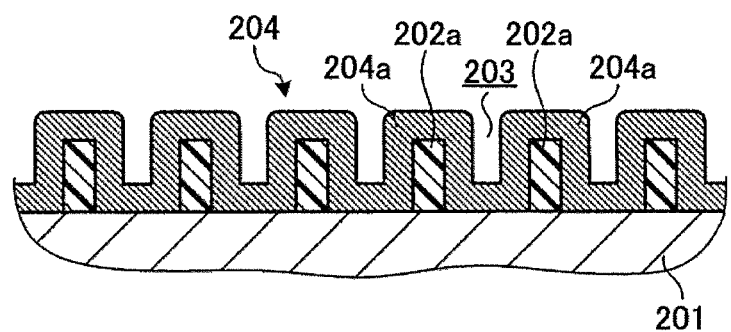

FIGS. 4A and 4B are cross-sectional views illustrating an example of a schematic structure of the object to be processed according to the exemplary embodiment. As illustrated in FIG. 4B, the object to be processed includes a film to be processed 201, an organic film 202 constituted by a plurality of narrow linear (line) portions formed on the film to be processed 201, and a rigid film 204 covering the plurality of linear (line) portions 202a and the film to be processed 201 exposed (in a space) between the respective linear (line) portions 202a of the organic film 202. Hereinafter, the present disclosure is described with respect to a case in which the organic film 202 is a photoresist, but the present invention is not limited thereto. Further, the linear (line) portions 202a illustrated in FIG. 4 are the portions of the organic film 202.

For example, the wafer W illustrated in FIG. 4A has the organic film 202 formed on the film to be processed 201. The film to be processed 201 is made of, for example, polysilicon. The organic film 202 is, for example, photoresist and is made of a positive photosensitive resin. The organic film 202 is formed in respective linear (line) portions 202a by lithography and has openings (space) 203 that expose the film to be processed 201 at respective locations. The width of each linear (line) portion 202a is approximately 60 nm or more just after the linear portion 202a is formed by the lithography. However, the width of each linear portion 202a is decreased to approximately 30 nm by, for example, ashing using oxygen radicals.

Herein, a method of forming the object to be processed illustrated in FIG. 4B will be described. For example, the wafer W illustrated in FIG. 4A is carried into a film forming apparatus and the film forming apparatus forms the rigid film 204 to cover the pattern on the surface of the wafer W by performing CVD (Chemical Vapor Deposition)-processing on the wafer W. The thickness of the rigid film is, for example, preferably 5 nm~30 nm, more preferably 5 nm~30 nm. The film forming apparatus is a plasma CVD apparatus, a heat CVD apparatus or an ALD (Atomic Layer Deposition) apparatus. Herein, the rigid film 204 is, for example, a Si oxide film. For example, the rigid film 204 is formed by using tetraethyloxysilane (TEOS) gas and oxygen gas. In this case, the silicon oxide is isotropically deposited to form the rigid film 204. As a result, the rigid film 204 covers the linear (line) portions 202a and the film to be processed 201 which are exposed in the openings (space) 203. The rigid film forms linear (line) portions 204a each of which has a width larger than that of each linear (line) portion 202a. The structure of FIG. 4B forms a first structure to which the plasma etching method to be described below is applied.

(Plasma Etching Method)

Figure 5:
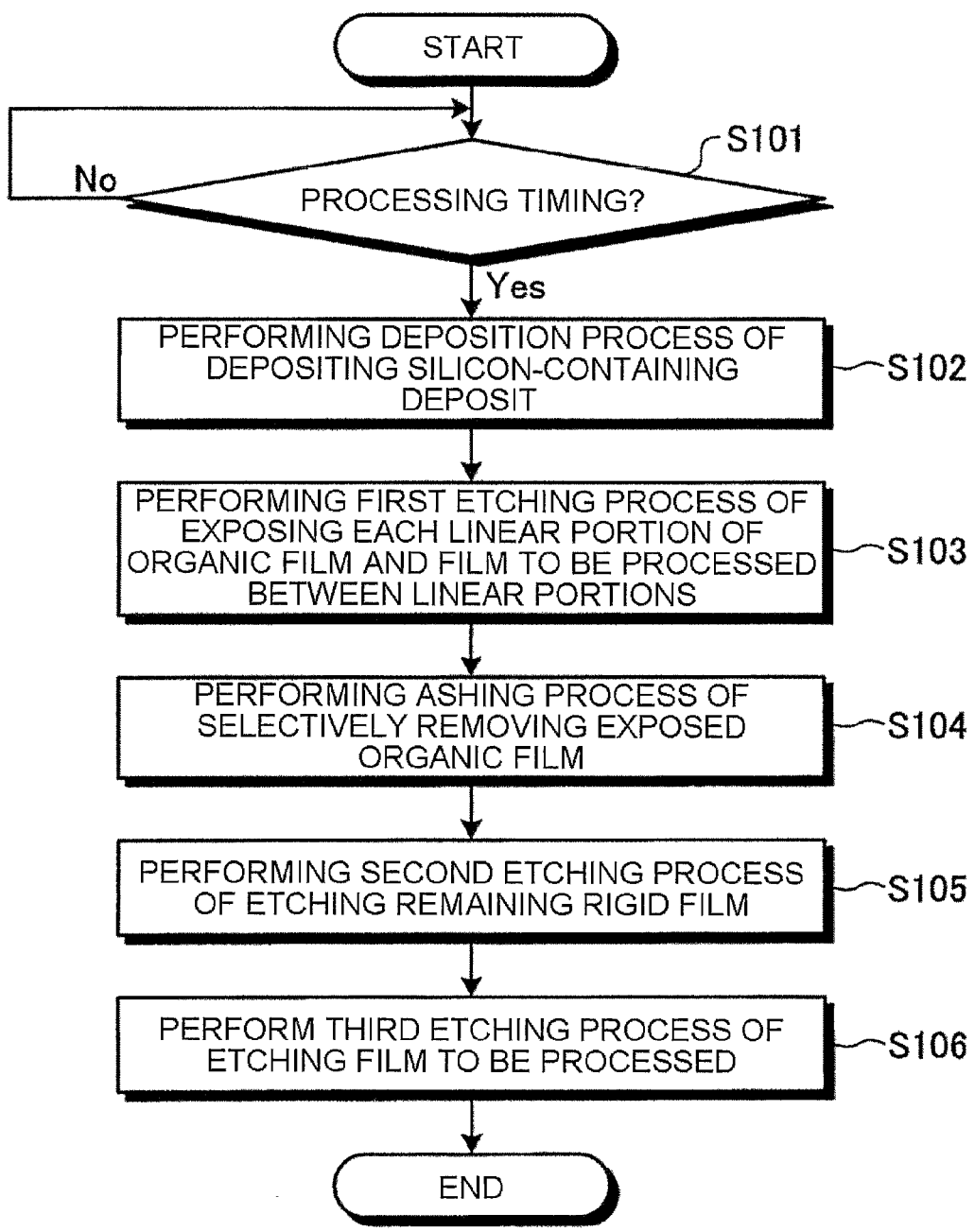
FIG. 5 is a flowchart illustrating a processing flow of a plasma etching method according to another exemplary embodiment.

FIG. 5 is a flowchart illustrating a processing flow of a plasma etching method according to an exemplary embodiment. FIGS. 6A to 6F are cross-sectional views illustrating an object to be processed step by step in the processing flow of the plasma etching method as illustrated in FIG. 5.

Figure 6A:
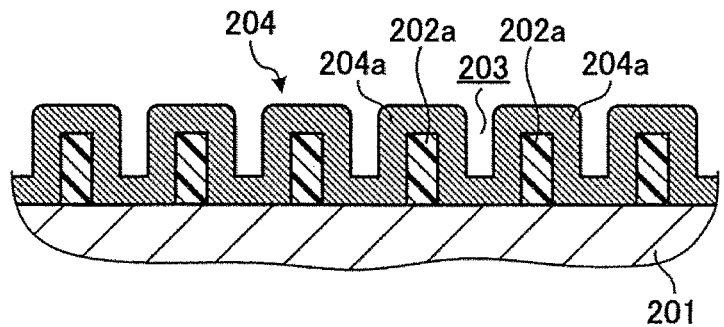
FIGS. 6A to 6F are cross-sectional views illustrating an object to be processed step by step in the processing flow of the plasma etching method according to the exemplary embodiment as illustrated in FIG. 5.
Figure 6B:
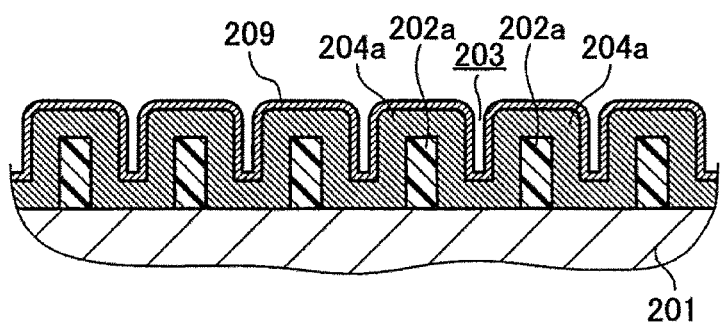

As illustrated in FIG. 5, in the plasma etching method according to the exemplary embodiment, when it is a processing timing (step S101), the plasma etching apparatus 100 performs a deposition process of depositing a silicon-containing deposit 209 by plasma processing using a Si-containing gas on an object to be processed (step S102). The film thickness of the silicon-containing deposit may be 10 nm~50 nm, or may be 15 nm~40 nm. When the film thickness range is satisfied, a film thickness which is sum of the silicon-containing deposit film thickness and the rigid film thickness is controlled such that an angle (shaving amount) of the shoulder portion of the upper portion of the line of the rigid film may be 55° or more, or may be 60° or more and 90° or less when the top of the pattern line, the rigid film of the space and the silicon-containing deposit are etched. As a result, when the film to be processed is etched, the line width is accurately and uniformly formed. The film thickness of the silicon-containing deposit may be thicker than or thinner than that of the rigid film, and it is desirable that a film thickness which is the sum of the thickness of the rigid film and that of the silicon-containing deposit is controlled. Specifically, the process controller 50 depressurizes the chamber 1 through the exhaust port 11 using a vacuum pump of the exhaust system 12 and supplies the Si-containing gas into the chamber 1 from the processing gas supply system 23 to perform a plasma processing by plasma of the Si-containing gas on an object to be processed. Also, the process controller 50 executes the plasma processing using the Si-containing gas while applying bias voltage to deposit a silicon-containing deposit 209. As a result, as illustrated in FIG. 6B, the silicon-containing deposit 209 is deposited on a rigid film 204. Further, FIG. 6A illustrates the object to be processed which is the same as that illustrated in FIG. 4B. Herein, the Si-containing gas includes, for example, $SiCl_4$ or $SiF_4$. The Si-containing gas may further include $O_2$ gas. The silicon-containing deposit may be deposited by a CVD film forming apparatus, a heat CVD apparatus or an ALD apparatus.

A more detailed example will be described. In the plasma etching apparatus 100, the object to be processed is placed on the electrostatic chuck 6. Then, the process controller 50 of the plasma etching apparatus 100 introduces a processing gas containing the Si-containing gas into the chamber 1 from the shower head 20 and applies high-frequency power for generating plasma into the chamber 1 from a second high-frequency power supply 26. The high-frequency power may be applied, for example, 64 MHz to 300 MHz (here, 100 MHz) to generate plasma from the Si-containing gas. Further, the process controller 50 applies high-frequency power so as to draw ions to the electrostatic chuck 6 from the first high-frequency power supply 15. The high-frequency power may be applied, for example, at 1 MHz to 13.56 MHz (here, 13.56 MHz in the present example) to draw ions in plasma towards the wafer W.

Figure 6C:
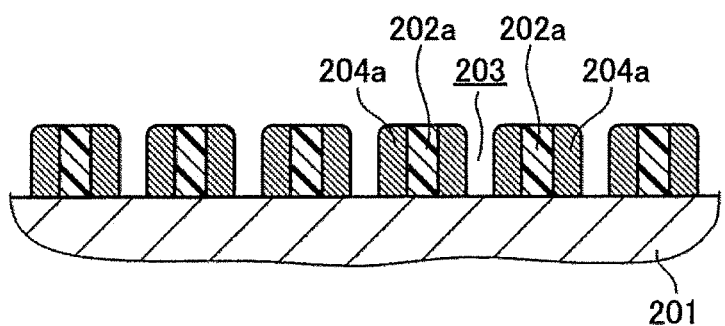

The plasma etching apparatus 100 performs a first etching process of exposing the respective linear (line) portions 202a of the organic film 202 and the film to be processed 201 (in a space) between the respective linear portions 202a of an organic film 202 by etching the silicon-containing deposit by plasma of CF-based gas and CHF-based gas after the silicon-containing deposit is deposited (step S103). As a result, as illustrated in FIG. 6C, the top portions of the linear (line) portions 202a are exposed and the portions of the film to be processed 201 which are positioned at the openings (space) 203 are exposed. Here, the CF-based gas contains $CF_4$ or $C_4F_8$ and the CHF-based gas contains any one of $CHF_3$, $CH_2F_2$, and $CH_3F$.

A more specific example will be described. In the plasma etching apparatus 100, the process controller 50 introduces a processing gas containing the CF-based gas and the CHF-based gas, for example, $CF_4/CH_3$ gas, into the chamber 1 from the shower head 20 and applies high-frequency power for generating plasma into the chamber 1 from the second high-frequency power supply 26. The high-frequency power may be applied, for example, at 64 MHz to 300 MHz (here, 100 MHz in the present example) to generate plasma from the CF-based gas and the CHF-based gas. Further, the process controller 50 applies high-frequency power for drawing ions to the electrostatic chuck 6 from the first high-frequency power supply 15. The high-frequency power may be applied, for example, at 1 MHz to 13.56 MHz (here, 13.56 MHz) to draw ions toward the wafer W. Further, the process controller 50 continuously performs processing until the apexes of the linear (line) portions 204a are removed to expose the internal linear (line) portions 202a and the rigid film 204 (in a space) between the linear (line) portions 204a is removed to expose the film to be processed 201 at the openings (space) 203.

Figure 7A:
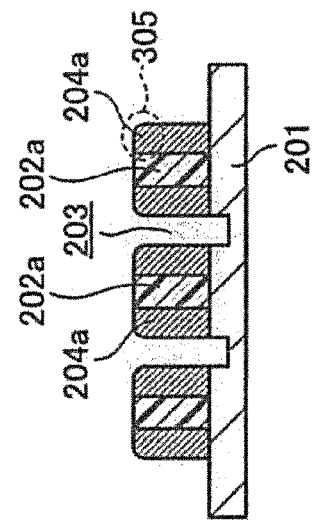
FIGS. 7A to 7C are views for further describing a first deposition process in the plasma etching method.
Figure 7A:
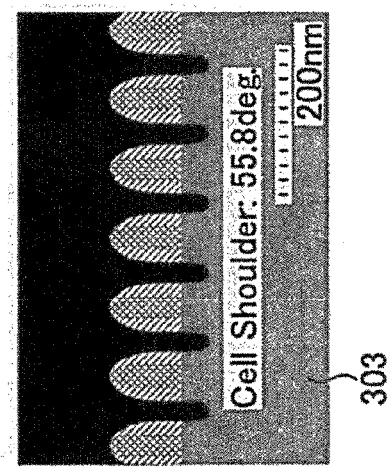
Figure 7B:
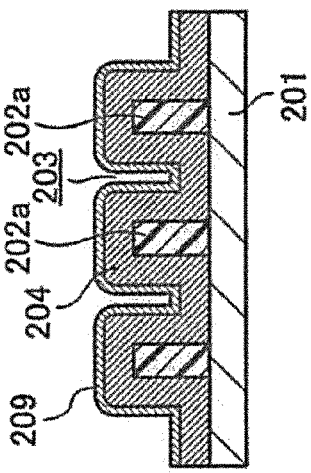
Figure 7B:
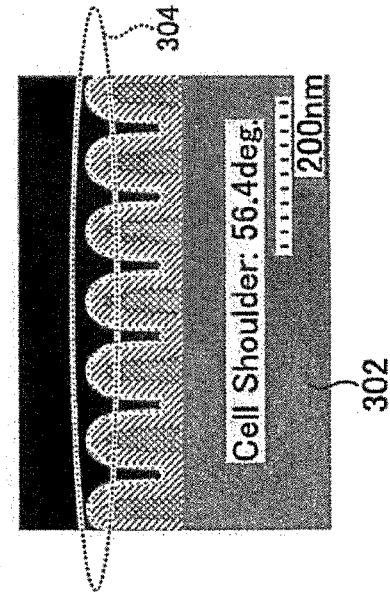
Figure 7C:
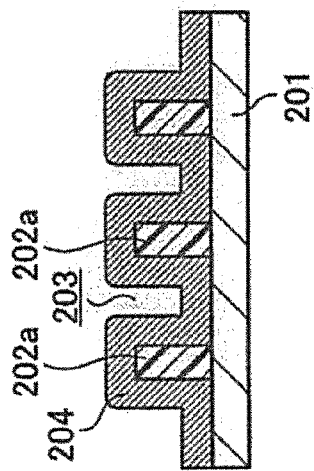
Figure 7C:
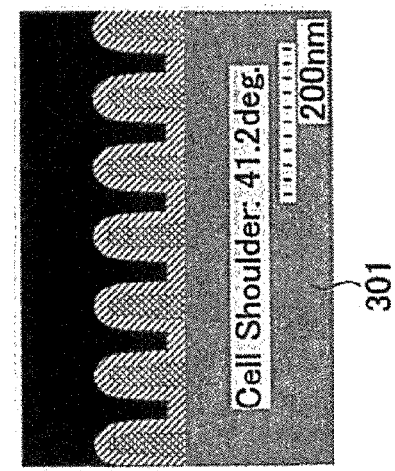

FIGS. 7A to 7C are views for further describing a first deposition process according to the exemplary embodiment. FIGS. 7A to 7C correspond to FIGS. 6A to 6C, respectively. The views indicated by reference numerals 301 to 303 in FIGS. 7A to 7C are trace drawings of cross-sectional images of the object to be processed in the FIGS. 7A to 7C. In the trace drawings 301 to 303, the "Cell Shoulder" represents an angle of a shoulder of a convex portion. When the angle of the shoulder is 90 degrees, the shoulder is formed at a right angle.

Referring to FIGS. 7A to 7C, when the silicon-containing deposit was not deposited as illustrated in FIG. 7A, the angle of the shoulder was "41.2" degrees. When the silicon-containing deposit was deposited as illustrated in FIG. 7B, the angle of the shoulder was "56.4" degrees. Then, after performing the first etching, in FIG. 7C, the angle of the shoulder decreases slightly as compared with that in FIG. 7A and the angle of the shoulder became "55.8" degrees. Here, when the deposition process is not performed, it is considered that the angle of the shoulder decreases as compared with FIG. 7A. That is, by performing the deposition process, the angle of the shoulder was further maintained as compared with the case in which the deposition process was not performed. In other words, it becomes possible to decrease a degree of rounding a portion 305 in the step where the first etching was finished.

Figure 6D:
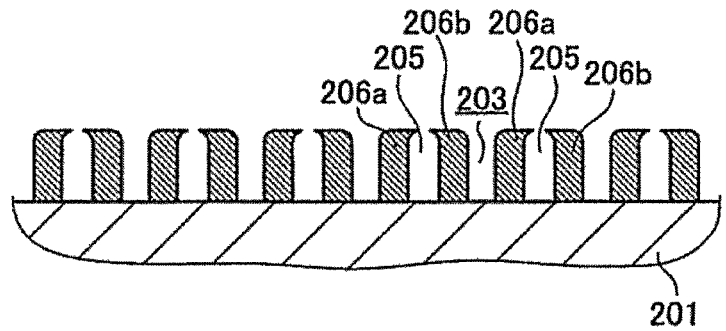

The plasma etching apparatus 100 performs an ashing process of selectively removing the exposed organic film 202 (step S104). As a result, as illustrated in FIG. 6D, the linear (line) portion 202a exposed from each of the linear portions 204a is selectively removed by ashing to form a space (groove) 205 and each of the linear (line) portions 204a is converted into a pair of linear (line) portions 206a and 206b.

For example, in the ashing process, in the plasma etching apparatus 100, the process controller 50 introduces a processing gas containing $O_2$ gas into the chamber 1 from the shower head 20 and applies the high-frequency power for generating plasma into the chamber 1 to generate plasma from the $O_2$ gas. Further, the process controller 50 draws the ions in the plasma generated by applying the high-frequency power for drawing ions to the electrostatic chuck 6 towards the wafer W.

Figure 6E:
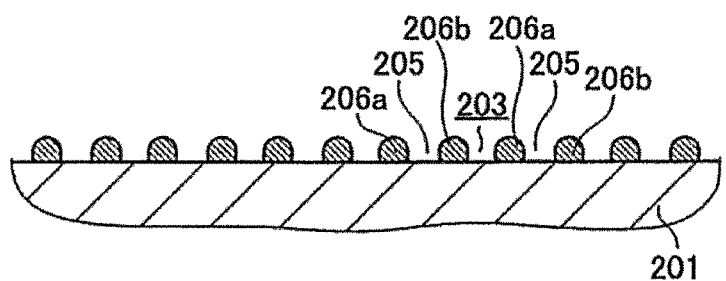

Then, the plasma etching apparatus 100 performs a second etching process of etching the remaining rigid film 204 (step S105). As a result, as illustrated in FIG. 6E, a curved tip portion is intensively removed to decrease the heights of the pair of linear (line) portions 206a and 206b. Therefore, the linear (line) portions 206a and 206b are formed to have laterally symmetric shapes. That is, the pair of linear (line) portions 206a and 206b made of the Si oxide is etched vertically in the figure and the heights of the linear portions 206a and 206b decrease. However, in general, ions tend to concentrate on a peaked portion in plasma etching. Thus, the peaked portion is first removed.

For example, in the second etching process, in the plasma etching apparatus 100, the process controller 50 introduces a processing gas containing $CF_4$ gas into the chamber 1 from the shower head 20 and applies the high-frequency power for generating plasma into the chamber 1 to generate plasma from the $CF_4$ gas. Further, the process controller 50 draws the ions in the plasma generated by applying the high-frequency power for drawing ions, for example, power having 100 W to the electrostatic chuck 6 towards the wafer W.

When the wafer W is viewed from the top, the side portions of each of the linear (line) portions 206a and 206b just after the linear (line) portion 202a is removed do not show a straight-line shape and have an uneven shape. In other words, the widths of the linear (line) portions 206a and 206b are varied rather than being constant. Here, when the second etching process is performed, the convex portions at the side portions of the linear (line) portions 206a and 206b are intensively removed. As a result, the shapes of the side portions of the linear (line) portions 206a and 206b become smooth, thereby reducing LWR (line width roughness).

Figure 6F:
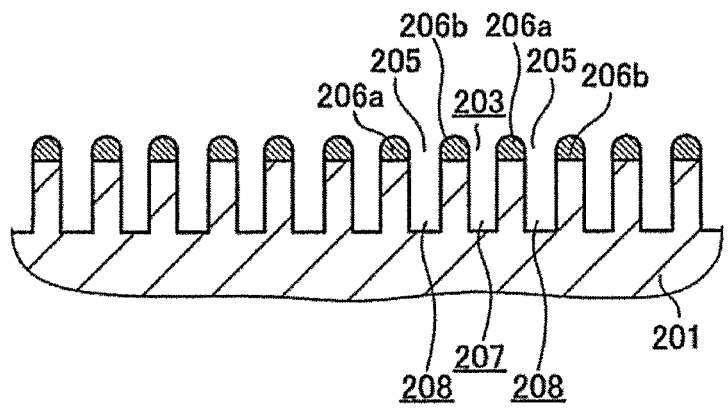

Thereafter, the plasma etching apparatus 100 performs a third etching process of etching the film to be processed 201 by using the remaining rigid film as a mask (step S106). As a result, as illustrated in FIG. 6F, the film to be processed 201 is etched by using the linear (line) portions 206a and 206b as the mask.

For example, in the third etching process, in the plasma etching apparatus 100, the process controller 50 introduces a processing gas containing HBr gas into the chamber 1 from the shower head 20 and applies the high-frequency power for generating plasma into the chamber 1 to generate plasma from the processing gas containing the HBr gas. Further, the process controller 50 draws the ions in the plasma generated by applying the high-frequency power for drawing ions to the electrostatic chuck 6 towards the wafer W. As a result, the film to be processed 201 which is not covered by the linear (line) portions 206a and 206b formed in laterally symmetric shapes is etched. Opening (space) 207 corresponding to the openings (space) 203 are formed on the film to be processed 201 and an opening (space) 208 corresponding to a gap (space) between the linear (line) portions 206a and 206b of each pair is formed. Also, since the linear (line) portions 206a and 206b do not have asymmetric shapes, ions that enter the gaps (space) between the pairs of linear (line) portions 206a and 206b do not collide with the curved tip portions but collide with the film to be processed 201 substantially vertically. As a result, the cross-sectional shape of each opening (space) 208 is not disturbed and the cross-sectional shape is a rectangular shape substantially vertical to the film to be processed 201.

As described above, according to the first exemplary embodiment, the deposition process of depositing the silicon-containing deposit 209 by a plasma processing using the Si-containing gas on the object to be processed is performed and, after the silicon-containing deposit is deposited, the first etching process of exposing the respective linear (line) portions 202a of the organic film 202 and the film to be processed 201 (in a space) between the linear (line) portions 202a is performed by etching using the plasma of the CF-based gas and the CHF-based gas. As a result, it becomes possible to remain the shoulders of the linear (line) portions 204a unlike a technique in which the deposition process is not performed. In other words, the shapes of the shoulders may be enhanced. As a result, precision of subsequent etching may be improved.

That is, when double patterning etching is performed, a shoulder having a mask shape may be etched to be rounded. In this regard, according to the exemplary embodiment, since the first etching is performed after the silicon-containing deposit 209 is deposited, the shape which causes the shoulders to be rounded may be enhanced.

According to the exemplary embodiment, the ashing process of selectively removing the exposed organic film 202, the second etching process of etching the remaining rigid film 204, and the third etching process of etching the film to be processed 201 by using the remaining rigid film 204 as the mask are further performed. As a result, the double patterning etching may be performed while enhancing the shape which causes the shoulders to be round.

According to the exemplary embodiment, bias voltage is applied in the deposition process. As a result, the silicon-containing deposit may be securely deposited.

According to the exemplary embodiment, the Si-containing gas contains $SiCl_4$ or $SiF_4$. As a result, the silicon-containing deposit may be securely deposited.

Also, according to the exemplary embodiment, the Si-containing gas further contains the $O_2$ gas. As a result, the $O_2$ gas and the Si-containing gas react with each other to certainly deposit the silicon-containing deposit as $SiO_2$.

According to the exemplary embodiment, the CF-based gas contains $CF_4$ or $C_4F_8$ and the CHF-based gas contains any one of $CHF_3$, $CH_2F_2$, and $CH_3F$. As a result, in the object to be processed in a state where the silicon-containing deposit is deposited, the respective linear (line) portions 202a of the organic film 202 and the film to be processed 201 between the linear (line) portions 202a may be securely exposed.

Other Exemplary Embodiments

Although the plasma etching apparatus and the plasma etching method according to the exemplary embodiment have been described above, the present disclosure is not limited thereto. Hereinafter, other exemplary embodiments will be described.

(Surface Modifying Processing)

For example, after the silicon-containing deposit is deposited, a surface modifying process of performing a surface modifying processing of the silicon-containing deposit by plasma using hydrogen gas may be further performed. In this case, in the first etching process, etching is performed after the surface modifying processing. For example, after the silicon-containing deposit is deposited by $SiCl_4$ gas, the deposited $SiO_2$ film is subjected to a processing by $H_2$ plasma. Then, the first etching is performed. As a result, as compared with a case in which the surface modifying processing is not performed, the shape which causes the shoulders to be rounded may be further enhanced.

(Object to be Processed)

For example, the object to be processed in the exemplary embodiment is not limited to the case as illustrated in FIG. 4B. For example, the Si oxide film is further provided below the organic film 202 and the film to be processed 201 may be provided therebelow.

For example, in the exemplary embodiment, in step S105 of FIG. 5, a case in which the high-frequency power for drawing ions which is applied to the electrostatic chuck 6 is 100 W when a pair of linear (line) portions 206a and 206b are etched is described as an example but the present disclosure is not limited thereto. For example, the applied high-frequency power may be lower than or higher than 100 W. Here, when the high-frequency power for drawing ions is low, the linear (line) portions 206a and 206b are not rapidly removed. As a result, the linear portions 206a and 206b may be easily formed in a desired shape by adjusting the duration time of etching. Further, since the linear portions 206a and 206b may be weakly etched only by generating self bias voltage caused by the high-frequency power for generating plasma without applying the high-frequency power for drawing ions to the electrostatic chuck 6, the high-frequency power for drawing ions may be 0 W.

For example, in the exemplary embodiment, each of the ashing process and the second etching has been performed only once. However, the present disclosure is not limited thereto. For example, the ashing process and the second etching process may be alternately repeated. In this case, when the linear (line) portions 202a are removed partially in the linear (line) portions 204a and the spaces 205 are expanded except for the top portions of the spaces 205 and thus, asymmetric shapes begin to occur, the ashing process is temporarily stopped and the linear (line) portions 206a and 206b are etched. At this time, curved tip portions which begin to occur are removed. Then, the ashing process is started again and the remaining linear (line) portions 202a are selectively removed. As a result, in the ashing process, the growth of asymmetric shapes may be suppressed. Further, the number of repetition times of the ashing process and the second etching process may be an arbitrary number.

For example, in the exemplary embodiment, in the wafer W, a case in which the rigid film 204 is formed by the CVD processing has been described as an example but the present disclosure is not limited thereto. For example, the rigid film 204 may be formed by the Si-containing gas such as, for example, BTBAS (Bis tertial butyl amino silane) and molecular layer deposition (MLD) using the oxygen radical, without decreasing the width of each linear (line) portion 202a of the organic film 202 in the wafer W. In this case, since C in the photoresist film 38 is consumed in forming the rigid film 204, the width of each linear (line) portion 202a is decreased. Accordingly, the formation of the rigid film 204 and the decrease of the width of each linear (line) portion 202a of the photoresist film 38 may be performed at the same time.

For example, in the exemplary embodiment, the Si oxide film is used as the rigid film 204, but the present disclosure is not limited thereto. As the rigid film, a film that may secure a selection ratio with respect to the organic film 202 and the film to be processed 201 may be used and, for example, a spin on glass (SOG) film or a SiC film may be used.

For example, as for the object to be processed a substrate subjected to an infinitesimal pitch line forming processing may be, for example, a wafer for a semiconductor device, various substrates used in a flat panel display (FPD) including, for example, a liquid crystal display, a CD substrate, and a printed circuit board.

Hereinafter, the plasma etching method of the present disclosure will be described in detail with reference to examples. However, the plasma etching method of the present disclosure is not limited to the examples described below.

Comparative Example 1

The first etching was performed on an object to be processed. The first etching was performed by using the following conditions.
(First Etching)
Processing gas: $CF_4/CHF_3$=80/180 sccm
Pressure: 8.0 Pa (60 mTorr)
High-frequency power (HF/LF): 250/50 W
Temperature (upper portion/side wall portion/lower portion): 80/70/60° C.

Example 1

The following deposition process below was performed and then, the first etching was performed on the object to be processed. The first etching was performed by setting the high-frequency power of a relatively low frequency to 0 W, 50 W, 100 W, respectively, under the same conditions as Comparative Example 1.
(Deposition Process)
Processing gas: $SiCl_4/O_2/He$=25/25/1200 sccm
Pressure: 1.3 Pa (10 mTorr)
High-frequency power (HF/LF): 500/0 W
Temperature (upper portion/side wall portion/lower portion): 80/70/60° C.
Time: 20 sec Example 2

In the deposition process, the following values were used as the high-frequency power. Other conditions are the same as those of Example 1.
High-frequency power (HF/LF): 500/50 W Example 3

In the deposition process, the following values were used as the high-frequency power. Other conditions are the same as those of Example 1.
High-frequency power (HF/LF): 500/100 W Processing Results of Comparative Example 1 and Examples 1 to 3

Figure 8:
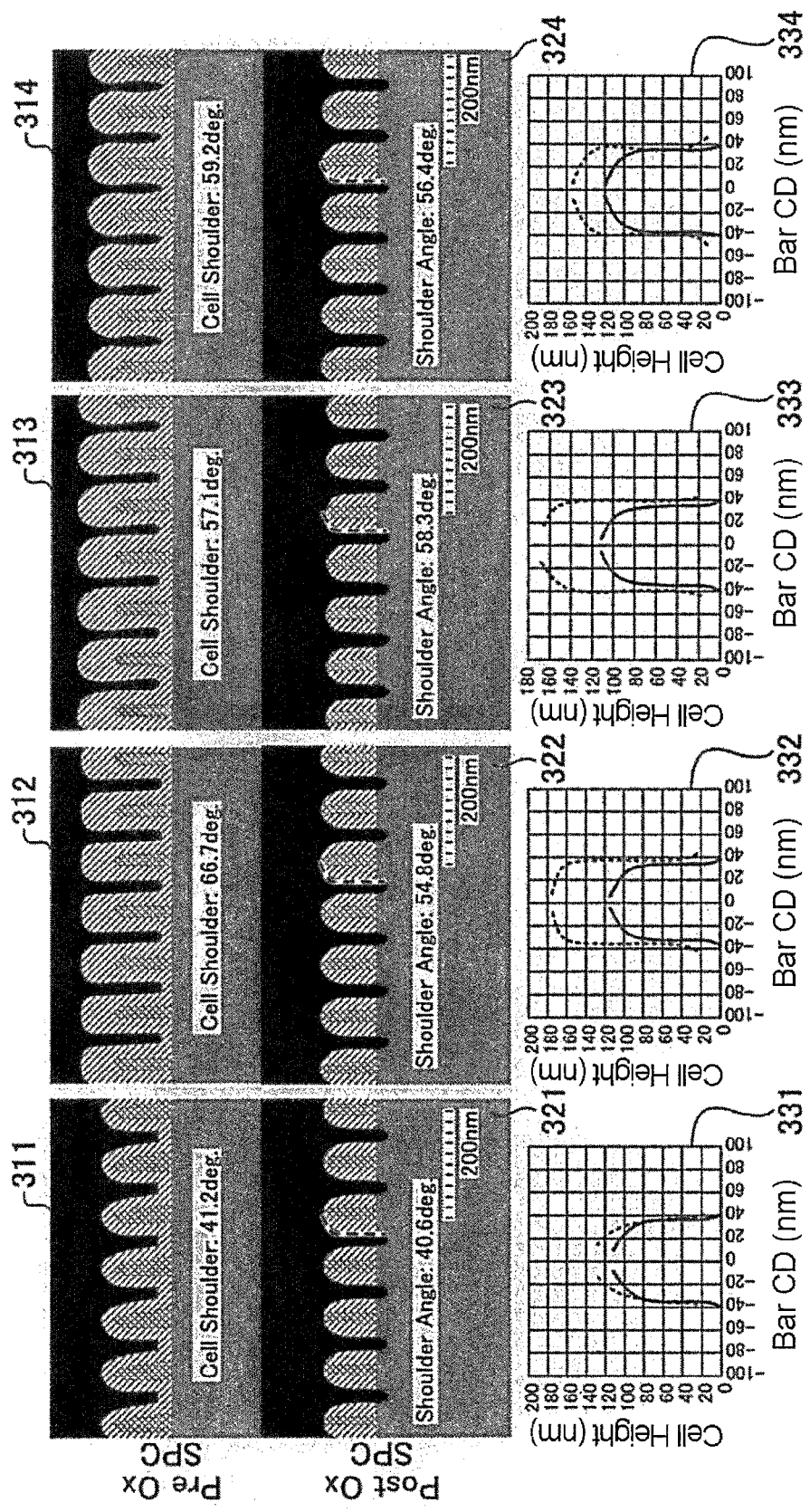
FIG. 8 is a view illustrating processing results regarding Comparative Example 1 and Examples 1 to 3.

FIG. 8 is a view illustrating processing results regarding Comparative Example 1 and Examples 1 to 3. Trace drawing 311 of FIG. 8 is a trace drawing of a cross-sectional view of an object to be processed before the first etching in Comparative Example 1. Trace drawing 321 is a trace drawing of the cross-sectional view of the object to be processed after the first etching in Comparative Example 1. Further, trace drawings 312 to 314 are trace drawings of the cross-sectional views of the object to be processed after the deposition process in Examples 1 to 3, respectively. Trace drawings 322 to 324 are trace diagrams of the cross-sectional view of the object to be processed after the first etching in Examples 1 to 3, respectively. Further, Tables 331 to 334 of FIG. 8 are views illustrating a contour shape of a convex portion in Comparative Example 1 and Examples 1 to 3, respectively. In Tables 331 to 334, a solid line represents a contour shape after the first etching and a dotted line represents a contour shape before the first etching. In the trace drawings, cell shoulders are also represented.

As illustrated in FIG. 8, as compared with Comparative Example 1 in which the deposition process is not performed, in Examples 1 to 3 in which the deposition process is performed, a value of the cell shoulder was enhanced after the first etching in any of Examples 1 to 3. In other words, in Examples 1 to 3, the shape of the shoulders was not so round and the shoulders remained as compared with Comparative Example 1.

As illustrated in FIG. 8, a silicon deposit may be deposited to be horizontally expanded by supplying the bias power as illustrated in Examples 2 and 3 as compared with Example 1 in which bias power is not applied. As a result, for example, in Example 2, the cell shoulder may be further enhanced as compared with Example 1.

Example 4

The following surface modifying process was performed on the object to be processed after the following deposition process was performed and then, the first etching was performed. The first etching was performed under the same condition as Comparative Example 1. From the result as described above, the bias power may be greater than 50 W and less than 300 W, or may be 100 W~200 W. Further, the silicon deposit on the upper side of the line may be formed to be slightly bulged.
(Deposition Process)
Processing gas: $SiCl_4/O_2/He$=25/25/200 sccm
Pressure: 1.3 Pa (10 mTorr)
High-frequency power (HF/LF): 500/0 W Temperature (upper portion/side wall portion/lower portion): 80/70/60° C.
Time: 20 sec
(Surface Modifying Process)
Processing gas: H2=300 sccm
Pressure: 6.5 Pa (50 mTorr)
High-frequency power (HF/LF): 200/0 W
Temperature (upper portion/side wall portion/lower portion): 80/70/20° C.
Time: 30 sec Processing Result of Example 4

Figure 9:
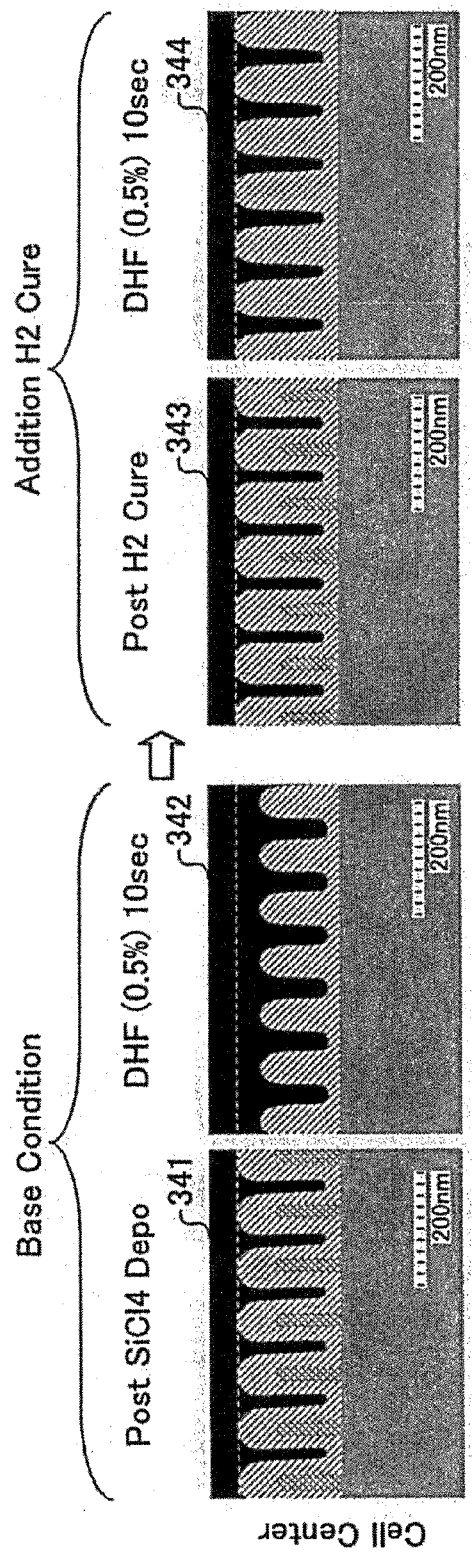
FIG. 9 is a view illustrating a processing result regarding Example 4.

FIG. 9 is a view illustrating a processing result of Example 4. Trace drawing 341 of FIG. 9 is a trace drawing of the cross-sectional view of the object to be processed after the deposition process in Example 1. Trace drawing 342 is a trace drawing of the cross-sectional view of the object to be processed when the object to be processed is washed with DHF (0.5%) after the deposition process in Example 1. Trace drawing 343 is a trace drawing of the cross-sectional view of the object to be processed after the deposition process in Example 4. Trace drawing 344 is a trace drawing of the cross-sectional view of the object to be processed when the object to be processed after the deposition process in example 4 is washed with DHF (0.5%).

Here, in the deposition process of Example 1, $SiO_2$ is deposited. As a result, when the object to be processed is washed with DHF, the silicon-containing deposit is melted as illustrated in trace drawing 342. In this regard, when the surface modifying process is performed, $O_2$ of $SiO_2$ deposited by the deposition process is reduced and thus, silicon is produced. As a result, as illustrated in trace drawing 344, when the object to be processed is washed with DHF, the silicon-containing deposit is not melted and remains as illustrated in trace drawing 342.

Herein, as compared with $SiO_2$, the silicon remaining on the surface increases the selection ratio during etching. That is, since the silicon is placed on the surface layer to be spaced apart from the film to be processed 201, close portions may be selectively etched by the shower head 20 and, as a result, the shoulders further remain. Therefore, the shoulders may further remain by performing the surface modifying process. Further, Si may be formed by the CVD and a Si electrode is used as an electrode of an etching apparatus to form the Si by a plasma sputter.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:
preparing an object to be processed in a processing chamber, the object to be processed including a film to be processed, an organic film formed in a plurality of first narrow linear portions on the film to be processed, and a rigid film that covers both the plurality of first narrow linear portions and the film to be processed which is exposed between the plurality of first narrow linear portions;
depositing a silicon-containing deposit on a surface of the rigid film within the processing chamber by a plasma process with plasma being generated by introducing Si-containing gas on the surface of the rigid film;
first etching the silicon-containing deposit and the rigid film by a plasma process with plasma being generated by introducing a processing gas including CF-based gas and CHF-based gas into the processing chamber, thereby exposing a top of each of the plurality of first narrow linear portions of the organic film and the film to be processed in first openings between the plurality of first narrow linear portions;
ashing and selectively removing the organic film so as to form a plurality of second linear portions and spaces between the second linear portions;
second etching the rigid film in each of the plurality of second linear portions; and
third etching the film to be processed using the rigid film of each of the second linear portions as a mask so as to form third openings,
wherein, the plurality of second linear portions are formed in a regular width in the second etching process, and the cross-section of each of the third openings is formed in a rectangular shape perpendicular to the film to be processed in the third etching process.

2. The plasma processing method of claim 1, wherein a bias voltage is applied in the depositing the silicon-containing deposit.

3. The plasma processing method of claim 1, further comprising:
performing a surface modifying processing on the silicon-containing deposit using plasma by hydrogen gas after the silicon-containing deposit is deposited,
wherein the silicon-containing deposit is etched after the surface modifying processing.

4. The plasma processing method of claim 1, wherein the CF-based gas contains $CF_4$ or $C_4F_8$ and the CHF-based gas contains any one of $CHF_3$, $CH_2F_2$, and $CH_3F$.

5. The plasma processing method of claim 1, wherein the Si-containing gas contains $SiCl_4$ or $SiF_4$.

6. The plasma processing method of claim 5, wherein the Si-containing gas further contains $O_2$ gas.

7. A double patterning forming method comprising:
forming an organic film on a film to be processed formed on an object to be processed;
forming, from the organic film by photolithography, a plurality of first narrow linear portions and first openings that expose the film to be processed;
forming a rigid film to cover the plurality of first narrow linear portions and the first openings that expose the film to be processed;
depositing a silicon-containing deposit by a plasma process using Si-containing gas on a surface of the rigid film;
first etching the silicon-containing deposit and the rigid film by a plasma with a processing gas including CF-based gas and CHF-based gas, thereby exposing a top of each of the first narrow linear portions of the organic film and the film to be processed in the first openings between the first narrow linear portions;
ashing and selectively removing the organic film so as to form a plurality of second linear portions and spaces between the second linear portions;
second etching the rigid film in each of the second linear portions; and
third etching the film to be processed using the rigid film of each of the second linear portions as a mask so as to form third openings, wherein, the plurality of second linear portions are formed in a regular width in the second etching process, and the cross-section of each of the third openings is formed in a rectangular shape perpendicular to the film to be processed in the third etching process.

8. The double patterning forming method of claim 7, wherein the second etching of the rigid film selectively etches the rigid film by plasma using Si-containing gas such that a degree of rounding of a shoulder portion of the rigid film is decreased.

9. The double patterning forming method of claim 7, wherein the Si-containing gas contains $SiCl_4$ or $SiF_4$, and $O_2$ gas, and the silicon-containing deposit is $SiO_2$.

* * * * *